US 7,467,124 B2

(12) United States Patent
Heer

(10) Patent No.: US 7,467,124 B2
(45) Date of Patent: Dec. 16, 2008

(54) ARRANGEMENT OF CONFIGURABLE LOGIC BLOCKS

(75) Inventor: Christoph Heer, Neubiberg (DE)

(73) Assignee: Infineon Technologies AG, Munich (DE)

( * ) Notice: Subject to any disclaimer, the term of this patent is extended or adjusted under 35 U.S.C. 154(b) by 668 days.

(21) Appl. No.: 10/724,011

(22) Filed: Nov. 26, 2003

(65) Prior Publication Data

US 2004/0127998 A1 Jul. 1, 2004

(30) Foreign Application Priority Data

Nov. 28, 2002 (DE) .............................. 102 55 768

(51) Int. Cl.
*G06F 17/00* (2006.01)
*G06N 7/00* (2006.01)
*G06N 7/08* (2006.01)

(52) U.S. Cl. .............................. 706/56; 706/57; 706/58

(58) Field of Classification Search .................. 327/12; 706/1, 15, 45, 16, 22, 33, 43, 14, 47; 700/1, 700/90; 365/185.2; 711/108; 326/46; 716/5; 364/200; 703/17; 358/1.9; 340/10.1, 10.3; 712/11

See application file for complete search history.

(56) References Cited

U.S. PATENT DOCUMENTS

| | | | | |
|---|---|---|---|---|
| 4,827,404 A | * | 5/1989 | Barstow et al. | ................ 703/20 |
| 6,181,164 B1 | * | 1/2001 | Miller | .......................... 326/46 |
| 6,317,362 B1 | * | 11/2001 | Nomura et al. | .......... 365/185.2 |
| 6,388,767 B1 | * | 5/2002 | Udagawa et al. | ............. 358/1.9 |
| 2002/0019969 A1 | * | 2/2002 | Hellestrand et al. | ............. 716/5 |
| 2002/0152060 A1 | * | 10/2002 | Tseng | ......................... 703/17 |
| 2002/0161969 A1 | * | 10/2002 | Nataraj et al. | ............... 711/108 |

FOREIGN PATENT DOCUMENTS

| | | |
|---|---|---|
| EP | 0 410 759 A2 | 1/1991 |
| JP | 9294069 | 11/1997 |

OTHER PUBLICATIONS

'Logic and Computer Design Fundamentals':M Morris Mano, Charles R Kime, Prentice Hall, 2001, pp. 29-31, 330-334, 351-352.*
'Logic and Computer Design Fundamentals':Mano, Kime, 1997, Prentice Hall, 2001, 29-31, 330-334, 351, 352.*

* cited by examiner

*Primary Examiner*—Joseph P. Hirl
*Assistant Examiner*—Peter Coughlan
(74) *Attorney, Agent, or Firm*—Slater & Matsil, L.L.P.

(57) ABSTRACT

A logic circuit includes at least one register and a corresponding comparator coupled to the register and an input data node. A multiplexer is coupled to the register. A control block is coupled to the multiplexer, the comparator, the input node and an input control node.

14 Claims, 1 Drawing Sheet

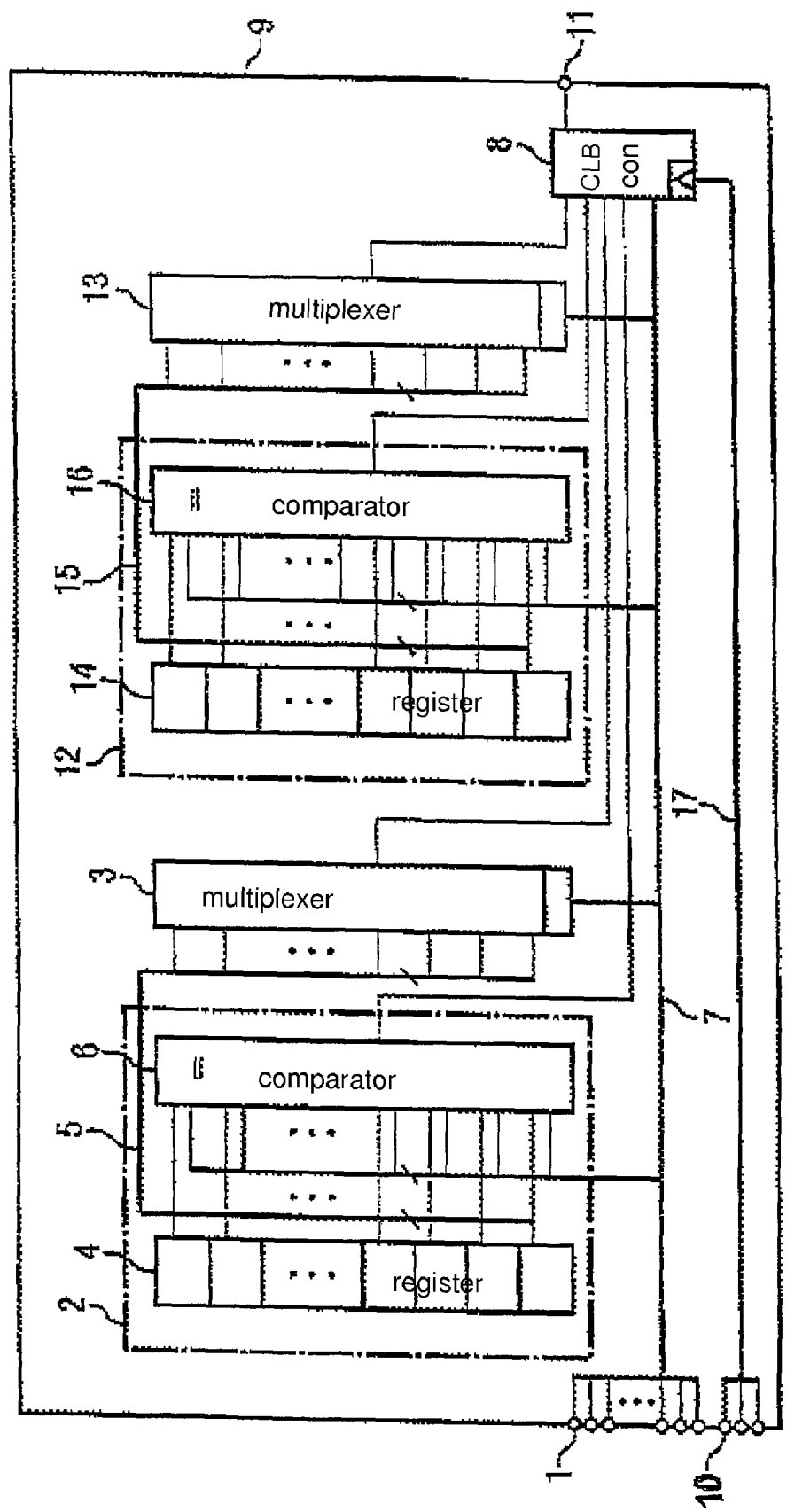

ARRANGEMENT OF CONFIGURABLE LOGIC BLOCKS

TECHNICAL FIELD

The present invention relates generally to a electronic circuits, and more particularly to an arrangement of configurable logic blocks.

BACKGROUND

Since their introduction in 1980, Field Programmable Logic Devices (FPLD) have been an integral component for digital circuit implementation. This modern variant for realizing digital circuitry offers great advantages relative to conventional VLSI designs in terms of production costs, short product development for the market (fast market maturity), and favorable system modification.

These FPLDs also exhibit complex programmable wiring in addition to programmable logic. Therefore, the realization of multi-stage logic is possible. Programmable wiring is typically realized in a corresponding switch matrix, which, however, limits the complexity of the wiring. Recent years, however, have shown especially strong development of applications for Field Programmable Gate Arrays (FPGA) in technological fields associated with FPLDs.

Because FPGAs allow arbitrarily distributed combinatorial logic circuits to be linked together with complex patterns using sequential circuit parts, this method can produce universal, scaleable circuits. Therefore, it is especially advantageous to design and manufacture user-programmable circuits in this technological field. This can be seen especially clearly in the state of the art in the tendency of frequent development of microcontrollers and procedure controllers, etc., as FPGAs.

A distinct number of large manufacturers (e.g., ACTEL, XILINX) have introduced their FPGAs, which can be programmed by the user, as de-facto standards to the market. For these available circuit types, one can define basic structures, for which the FPGAs consist of an array of complex logic blocks. Here, not only the configurations of logic blocks themselves, but also the connections between the logic blocks, can be programmed.

Thus, in the state of the art, the combinatorial circuit part of a common configurable logic block (CLB) consists of look-up tables (LUT), which are preferably realized by static RAM. Arbitrary combinatorial functions, which are represented by truth tables, are converted into these look-up tables. For these truth tables, one also speaks of function tables, which can be realized by matrix memories and expanded, e.g., by multiplexers, or just by the memories alone.

The sequential functions of the configurable logic blocks (CLB) are executed by sequential CLB control logic, whose memory elements represent D-FFs. Because the individual CLBs are usually arranged like a grid in FPGAs, the wiring of these CLBs is also grid-like. The programmable wiring of the CLBs mentioned above is realized by switches at the interfaces, e.g., with so-called pass transistors.

The FPLDs in general and the FPGAs in particular are preferably used for applications in communications technology, in process control technology, for industrial device controllers, etc., because these areas of application are very computation-intensive. On one hand, FPGAs have also gained widespread importance for implementing signal processes and algorithms, because here, these can be executed very effectively as parallel processes. On the other hand, the transformation of such parallel calculations into hardware realized by FPGAs also means that complex computational and control processes, as represented, e.g., by conditional branches, experience a similarly complex realization in their CLBs.

For this realization of CLBs, it is obvious that for certain applied cell architectures, which are characterized by frequent applications of standard cell gates (fine-grain), many wiring elements are necessary and/or for frequent use of complex logic (coarse-grain), logic also frequently remains unused. To realize complex user circuits using this FPGA technology, these difficult-to-balance portions of unused logic elements and/or additional wiring elements have a counter tendency to lower the efficiency, which leads to a somewhat higher use of area for the circuit, e.g., relative to comparable VLSI/CPLD realizations.

SUMMARY OF THE INVENTION

In a first aspect, the present invention relates to an arrangement of configurable logic blocks (CLB) in customer-specific circuits, which are realized in Field Programmable Gate Array (FPGA) technology, wherein the CLBs comprise one or more look-up tables (LUT), a first and/or second multiplexer, and CLB control logic.

The preferred embodiment of the invention relates to an arrangement of CLBs, which are realized in FPGA technology, and solves the problem according to the invention of minimizing use by adapting its corresponding components to the functional task of the CLB, wherein a CLB contains a first and/or second look-up table, in which the switching function of at least one conditional branch is implemented. Thus, the data input of the CLB is connected via an input data bus on one hand to a corresponding bus input of a first and/or second look-up table and on the other hand at least in parts of the bit width of the input data bus to a corresponding multiplexer control input of the first and/or second multiplexer and also to the first input of the CLB control logic and a control input of the CLB is attached via a control bus to a second input of the CLB control logic. In addition, a corresponding result output of the first and/or second look-up table is associated with the third or fourth input of the CLB control logic and a corresponding register data bus output of the first and/or second look-up table is connected to a corresponding bus input of the first or second multiplexer. One output of the first and/or second multiplexer is connected to a fifth or sixth input of the CLB control logic and an output of the CLB control logic forms an output of the CLB.

BRIEF DESCRIPTION OF THE DRAWING

For a more complete understanding of the present invention, and the advantages thereof, reference is now made to the following descriptions taken in conjunction with the accompanying drawing, in which the lone FIGURE shows the arrangement of a configurable logic block (CLB) implemented according to a preferred embodiment of the invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will first be described by textual description so that some of the concepts and advantages can be understood. A particular implementation of these concepts will then be described with respect to the FIGURE.

The preferred embodiment of the invention provides a solution to the problem of minimizing the use of area for configurable logic blocks (CLB) and is achieved by adapting its corresponding components to the functional task of the CLB. Thus, in the solution of the problem according to embodiments of the invention, a CLB contains a first and/or second look-up table with content addressability, which implements the switching function of at least one conditional branch. This conditional branch generates an "if then else" branch, which realizes a comparison of CLB input data with comparison data previously stored in the CLB.

Here, the data input of the CLB is connected via an input data bus on one hand to a corresponding bus input of a first and/or second look-up table and on the other hand at least in one part of the bit width of the input data bus to a corresponding multiplexer control input of the first and/or second multiplexer and also to the first input of the CLB control logic. Furthermore, a control input of the CLB is connected over a control bus to a second input of the CLB control logic.

In addition, a corresponding result output of the first and/or second look-up table is assigned to the third or fourth input of the CLB control logic and a corresponding register data bus output of the first and/or second look-up table is connected over a first and/or register data bus to a corresponding bus input of the first or second multiplexer. One output of the first and/or second multiplexer is connected to a fifth or sixth input of the CLB control logic and one output of the CLB control logic forms an output of the CLB.

Thus, this solution according to the preferred embodiment of the invention has the goal of preventing the use of three otherwise additional conventional LUTs in a CLB through the implementation of a conditional branch with its corresponding switching function in a special LUT. In this way, a considerable portion of the surface area required by the FPGAs is spared for the realization of the user-specific circuit.

In one special configuration of the solution of the problem according to embodiments of the invention, the first and/or second look-up table (LUT) is realized with the conditional branch implemented in it through such a switching function, and these first and/or second look-up tables each contain a first or second register, in which the corresponding comparison datum is stored. Furthermore, the LUTs each have a first or second comparator comparing the input data with the stored comparison data, wherein the corresponding bus input of the first and/or second look-up table is connected to a corresponding first bus input of the first or second comparator.

A corresponding bus output of the first and/or second register is connected to a corresponding second bus input of the first or second comparator and also to the corresponding register data bus output of the first and/or second look-up table. In addition, a corresponding output of the first and/or second comparator is switched with the corresponding result output of the first and/or second look-up table.

This special configuration of the solution according to embodiments of the invention shows its advantage in that for the implementation of more than one conditional branch in an LUT, an additional savings of hardware resources is achieved by reducing the required CLBs. In addition, here it is favorably guaranteed that the comparison data, which are stored in the LUT and which are required for processing with the CLB controller, are also simultaneously already available for further processing in typical multiplexers of a CLB. Therefore, additional hardware, which would otherwise be necessary, is likewise spared for each CLB that is used.

A particular implementation of the invention will now be explained in more detail in the following with reference to the FIGURE. The associated drawing shows the arrangement of the CLB 9 with the first and second look-up tables (LUT) 2; 12 implemented according to one embodiment of the invention.

This drawing shows the CLB 9, which includes the first and second LUT 2; 12 and also the first and second multiplexer 3; 13, and the CLB control logic 8, wherein within the first and second LUT 2; 12 are first and second registers 4; 14 and also first and second comparators 6; 16, respectively.

From the data input 1 of the CLB 9, the resulting data are led via the input data bus 7 to the corresponding bus input of the first or second LUT 2; 12 and thus to the corresponding first bus input of the first or second comparator 6; 16. Simultaneously, these data are led in one part of the bit width of the input data bus 7 to the corresponding multiplexer control input of the first and/or second multiplexer 3; 13 and also to the first input of the CLB control logic 8. From the control input 10 of the CLB 9, the control data are led over the control data bus 7 to the second input of the CLB control logic 8.

The corresponding comparison data, which are stored in the first or second register 4; 14, are applied to the corresponding second bus input of the first or second comparator 6; 16. These data are likewise led to the register data bus output of the first and/or second look-up table 2; 12 and dare switched over a corresponding first or second register data bus 5; 15 to the bus input of the first or second multiplexer 3; 13.

The result of the corresponding comparison of the resulting input data with the stored comparison data is output of the first or second comparator 6; 16 and is led over the corresponding result output of the first and/or second look-up table 2; 12 to the third or fourth input of the CLB logic 8. The signal applied to the corresponding output of the first or second multiplexer 3; 13 is made available on the fifth or sixth input of the CLB control logic 8. Its output signal is switched to the data output 11 of the CLB 9.

The Table 1 provides a list of the reference numerals used in the FIGURE and the corresponding element of the illustrated embodiment.

TABLE 1

| | |
|---|---|
| 1 | Data input |
| 2 | First look-up table (LUT) |
| 3 | First multiplexer |
| 4 | First register |
| 5 | First register data bus |
| 6 | First comparator |
| 7 | Input data bus |
| 8 | CLB control logic |
| 9 | CLB (configurable logic block) |
| 10 | Control input |
| 11 | Data output |
| 12 | Second look-up table (LUT) |
| 13 | Second multiplexer |
| 14 | Second register |
| 15 | Second register data bus |
| 16 | Second comparator |
| 17 | Control data bus |

In one aspect, the present invention provides an arrangement of configurable logic blocks (CLB) in customer-specific circuits, which are realized in Field Programmable Gate Array (FPGA) technology, wherein the CLBs comprise one or more look-up tables (LUT), a first and/or second multiplexer, and a CLB control logic, characterized in that a CLB (9) contains a first and/or second look-up table (2), (12), in which the switching function of at least one conditional branch is implemented with content addressability, which generates an "if then else" branch, which realizes a comparison of input data of the CLB (9) with comparison data previously stored in the LUT, wherein the data input (1) of the CLB (9) is connected via an input data bus (7) on one hand to a corresponding bus input of a first and/or second look-up table (2), (12) and on the other hand at least in one part of the bit width of the input data bus (7) to a corresponding multiplexer control input of the first and/or second multiplexer (3), (13), and also to a first input of the CLB control logic (8); a control input (10) of the CLB (9) is attached over a control bus (17) to a second input of the CLB control logic (8); a corresponding result output of the first and/or second look-up table (2), (12) is assigned to the third or fourth input of the CLB control logic (8); a corresponding register data bus output of the first and/or second look-up table (2), (12) is connected over a first and/or second register data bus (5), (15) to a corresponding bus input of the first or second multiplexer (3), (13); an output of the first and/or second multiplexer (3), (13) is connected to a fifth or sixth input of the CLB control logic (8); and an output of the CLB control logic (8) forms an output of the CLB (9).

For example, this arrangement can be characterized in that the first and/or second look-up table (2), (12) is realized with the conditional branch implemented in it by such a switching function, for which these first and/or second look-up tables (2), (12) each contain a first or second register (4), (14), which stores the corresponding comparison data, and each table further has a first or second comparator (6), (16) comparing the input data with the stored comparison data, wherein the corresponding bus input of the first and/or second look-up table (2), (12) is connected to a corresponding first bus input of the first or second comparator (6), (16) and a corresponding bus output of the first and/or second register (4), (14) is connected to a corresponding second bus input of the first or second comparator (6), (16), and also to the corresponding register data bus output of the first and/or second look-up table (2), (12), and a corresponding output of the first and/or second comparator (6), (16) is switched with the corresponding result output of the first and/or second look-up table (2), (12).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A logic circuit comprising:
   an input data node for carrying input data;
   a configurable logic block (CLB) control logic circuit having a first input, a second input, a third input, a fourth input and an output;
   at least one look-up table in which a switching function of at least one conditional branch is implemented with content addressability, wherein the at least one look-up table generates an "if then else" branch that realizes a comparison of the input data with comparison data previously stored in the at least one look-up table, and wherein a result output of the at least one look-up table is provided to a third input of the CLB control logic circuit;
   an input data bus coupled between the input data node and a bus input of the at least one look-up table, wherein the first input of the CLB control logic circuit is coupled to the input data node via the input data bus;
   at least one multiplexer having a control input coupled to the input data node and also to the first input of the CLB control logic circuit via at least part of the bit width of the input data bus, an output of the at least one multiplexer being coupled to a fourth input of the CLB control logic circuit;
   a control input node coupled via a control bus to the second input of the CLB control logic circuit; and
   at least one register data bus coupled between a register data bus output of the at least one look-up table and a bus input of the at least one multiplexer.

2. The circuit of claim 1, wherein the at least one look-up table is realized with the conditional branch implemented in it by such a switching function, and wherein the at least one look-up table comprises:
   a register which stores the comparison data; and
   a comparator coupled to the input data node and the register, the comparator operable to compare the input data with the comparison data.

3. The circuit of claim 2 wherein the bus input of the at least one look-up table is coupled to a first bus input of the comparator and wherein a bus output of the register is coupled to a second bus input of the comparator and also to the register data bus output of the at least one look-up table, and wherein an output of the comparator is coupled to the result output of the at least one look-up table.

4. The circuit of claim 1 wherein the configurable logic blocks are realized in Field Programmable Gate Array (FPGA) technology.

5. The circuit of claim 1 wherein the output of the CLB control logic circuit serving as an output of the CLB.

6. A logic circuit comprising:
   a register;
   a comparator with a first input coupled to the register and with a second input coupled to an input node;
   a multiplexer with an input coupled to the register; and
   a control block with inputs coupled to the multiplexer, the comparator, the input node and an input control node, wherein the logic circuit realizes an "if then else" branch based upon information carried at the input node and information stored in the register.

7. The circuit of claim 6 wherein the logic circuit comprises a configurable logic block.

8. The circuit of claim 7 wherein the configurable logic blocks are realized in Field Programmable Gate Array (FPGA) technology.

9. The circuit of claim 6 and further comprising:
   a second register;
   a second comparator with a first input coupled to the second register and with a second input coupled to the input node;
   a second multiplexer with an input coupled to the second register; and
   wherein the control block is coupled to the second comparator and the second multiplexer.

10. The circuit of claim 6 wherein the output of the control block logic serves as an output of the logic circuit.

11. A logic circuit comprising:
    means for performing a switching function of at least one conditional branch is implemented with content addressability, wherein the means for performing a switching function generates an "if then else" branch that realizes a comparison of input data with previously stored comparison data;
    means, coupled to the means for performing a switch function, for selecting at least a portion of the comparison data; and a CLB control logic circuit having a first input coupled to receive at least a portion of the input data, a second input coupled to the means for performing a switching function, and a third input coupled to the means for selecting.

12. The circuit of claim 11 wherein the means for performing a switching function comprises:

means for storing the comparison data; and means for comparing the comparison data and the input data.

13. The circuit of claim 11 wherein the means for performing a switching function comprises:

a register that stores the comparison data; and a comparator coupled to the register and to an input data node that carries the input data.

14. The circuit of claim 1 wherein the logic circuit is realized in Field Programmable Gate Array (FPGA) technology.

* * * * *